United States Patent [19]
Decramer et al.

[11] Patent Number: 6,118,354
[45] Date of Patent: Sep. 12, 2000

[54] HIGH FREQUENCY SPLITTER

[75] Inventors: John E. Decramer, Marshall; Franklin B. Gass, Slayton, both of Minn.

[73] Assignee: BH Electronics, Inc., Burnsville, Minn.

[21] Appl. No.: 09/192,726

[22] Filed: Nov. 16, 1998

[51] Int. Cl.[7] .................................................. H03H 7/48
[52] U.S. Cl. ............................................ 333/131; 333/32
[58] Field of Search ...................................... 333/119, 131

[56]  References Cited

U.S. PATENT DOCUMENTS

| | | | |
|---|---|---|---|
| 3,673,517 | 6/1972 | Ticknor | 333/131 |
| 3,983,486 | 9/1976 | Rheinfelder | 330/148 X |
| 5,237,295 | 8/1993 | Reddick et al. | 333/131 |
| 5,347,245 | 9/1994 | Wright, Jr. | 333/131 |
| 5,483,208 | 1/1996 | Spriester | 333/131 |
| 5,901,340 | 5/1999 | Flickinger | 455/3.1 |
| 5,909,155 | 6/1999 | Anderson et al. | 333/100 |

*Primary Examiner*—Paul Gensler
*Attorney, Agent, or Firm*—Douglas J. Christensen

[57]  ABSTRACT

A multi level splitter device suitable for CATV distribution systems utilizes transformers with bi-multiplefilar windings as well as impedance matching transformers selectively placed and port isolation techniques to provide excellent performance throughout a very broad frequency range. The device may utilize a standard JEDEC surface mount package, for example a 84 pin PLCC package which allows isolation of each of the output port terminals intermediate grounded terminals minimizing output line to output line crosstalk. Further, output line isolation is provided by use of resistors across adjacent "split" output lines.

16 Claims, 5 Drawing Sheets

HIGH FREQUENCY SPLITTER

BACKGROUND OF THE INVENTION

This invention relates to signal splitters, more particularly the invention relates to splitters with multiple branch circuits suitable for splitting signals over a very wide frequency range.

In distribution systems, such as CATV (community antenna television) systems, a television signal originating at one location is split, often many times, between the originating location and the destination locations. In the simplest form a split may be accomplished by an input signal line connecting to a center tap on a winding of a distribution transformer with the end leads of the winding constituting the two new signal lines. This results in the characteristic impedance at each of the new signal lines being twice that at the input signal line. It is known to utilize a matching transformer at the input signal line before the distribution transformer to appropriately reduce the characteristic impedance at the signal line intermediate the transformers to half that at the input signal line. Then the doubling effect of the characteristic impedance at the distribution transformer results in each of the output signal lines with the same characteristic impedance as at the input signal line. See U.S. Pat. No. 5,347,245 to Wright, which is hereby incorporated by reference.

In splitters for use with CATV, and the like, it is important to have excellent return loss characteristics at the ports as well as reasonable insertion loss characteristics and port isolation characteristics, all of which should be maintained throughout the frequency spectrum of the device. The wider the operable frequency spectrum, the better.

Prior art splitters have attempted to provide favorable performance characteristics over a wide range of frequencies but have generally proved deficient, particularly in the higher frequencies, i.e. 500 to 750 mhz.

A multiple output port splitter device is needed that provides excellent performance characteristics from 5 mhz. to 750 mhz.

SUMMARY OF THE INVENTION

Particular embodiments of the multi level splitter device utilize transformers with unique bi-multiplefilar windings as well as impedance matching transformers selectively placed and port isolation techniques to provide excellent performance throughout a very broad frequency range. The splitter device utilizes an initial, intermediate and a final splitting stages with each of the stages having distribution transformers and with impedance matching transformers positioned ahead of the distribution transformers. The transformers utilize high permeability toroid cores to support the bi-multiplefilar winding providing very favorable performance over a very wide frequency range.

An object and advantage of particular embodiments of the invention is that excellent return loss characteristics are provided throughout a very broad frequency range.

An additional advantage and feature of particular embodiments of the invention is that the circuitry of the device is mounted on a standard JEDEC surface mount package, for example a 84 pin PLCC package which allows easy customer integration of the component. Moreover this type of package provides surprisingly favorable characteristics by allowing isolation of each of the output port terminals intermediate grounded terminals minimizing output line to output line crosstalk. Additionally, in particular embodiments of the invention further output line isolation is provided by use of resistors across adjacent "split" output lines.

A further advantage of particular embodiments of the invention is that the characteristics of each output signal line is virtually identical.

Particular embodiments of the invention may utilize matching transformers in only some and not all of the splitting stages. For example, a matching transformer may be utilized in the initial splitting stage and in one or more intermediate stages but not in the final splitting stage. Such a configuration provides a favorable input return loss which is frequency insensitive.

Another object and advantage of particular embodiments of the invention is that the bi-trifilar windings in the transformers reduces parasitic inductance, increases the effective surface area of current carrying conductors, overcoming the RF skin effect.

Moreover, in particular embodiments of the invention, low value capacitors are placed throughout the circuit to effectively lower the impedance at particular points.

Another object and feature of particular embodiments of the invention is that all distribution transformers and matching transformers are wound on a high permeability toroid core providing effective operation at low frequencies.

BRIEF DESCRIPTIONS OF THE DRAWINGS

DETAILED DESCRIPTIONS OF PREFERRED EMBODIMENTS

Note that the use of input, output, initial, final, and similar terms are used as a convenience in identifying the respective positions of portions of the invention. The signal splitter is also functional as a signal combiner and in such use the actual signal input would be at the signal output port. Thus, when used herein, input, output, initial, final, and like terms indicate relative positioning and are not to be construed to require that signal conditioning occurs in a particular direction in the device.

Figure 1:
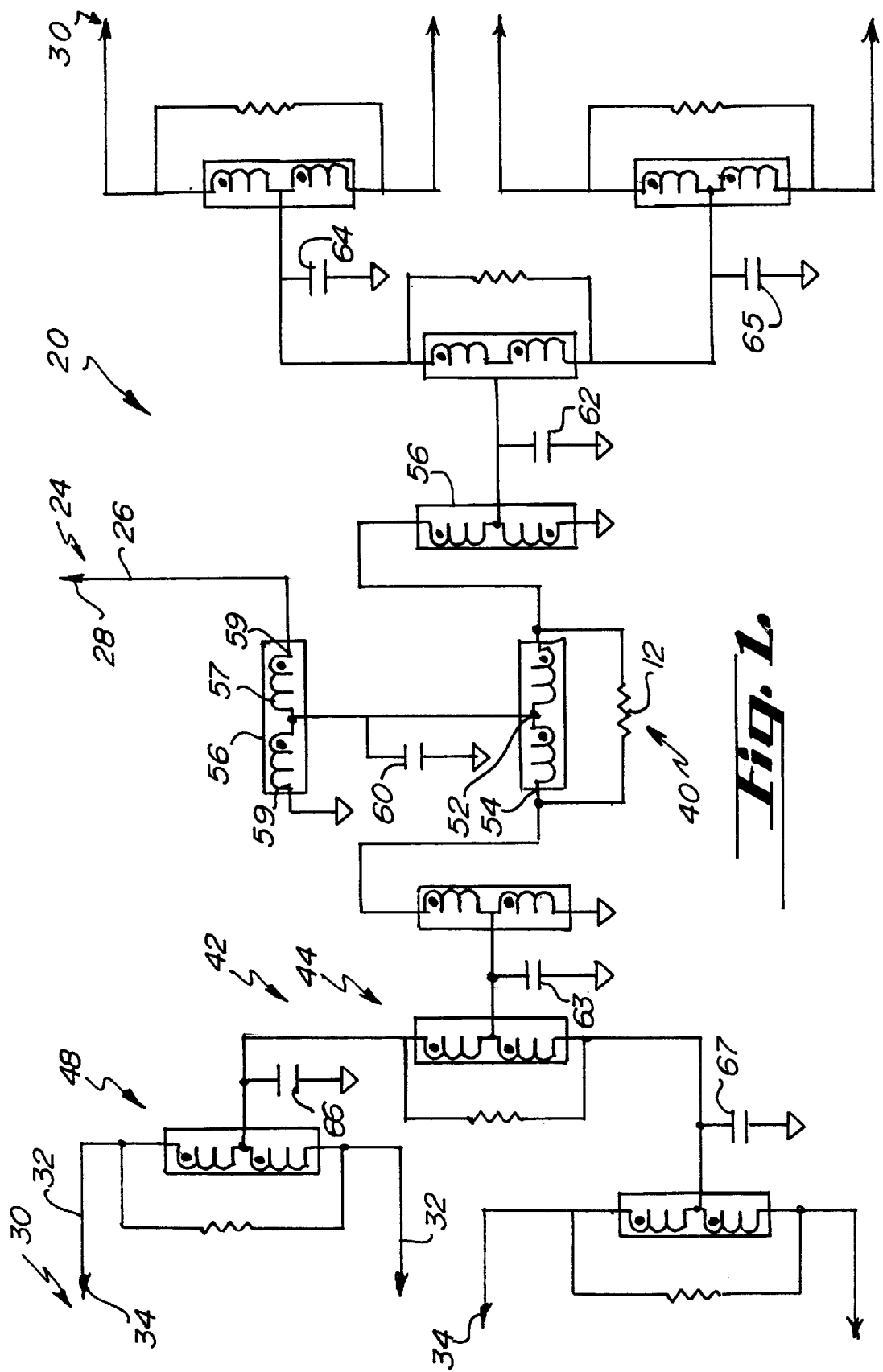
FIG. 1 is a schematic diagram of a signal splitter with eight output lines according to the invention.
Figure 2A:
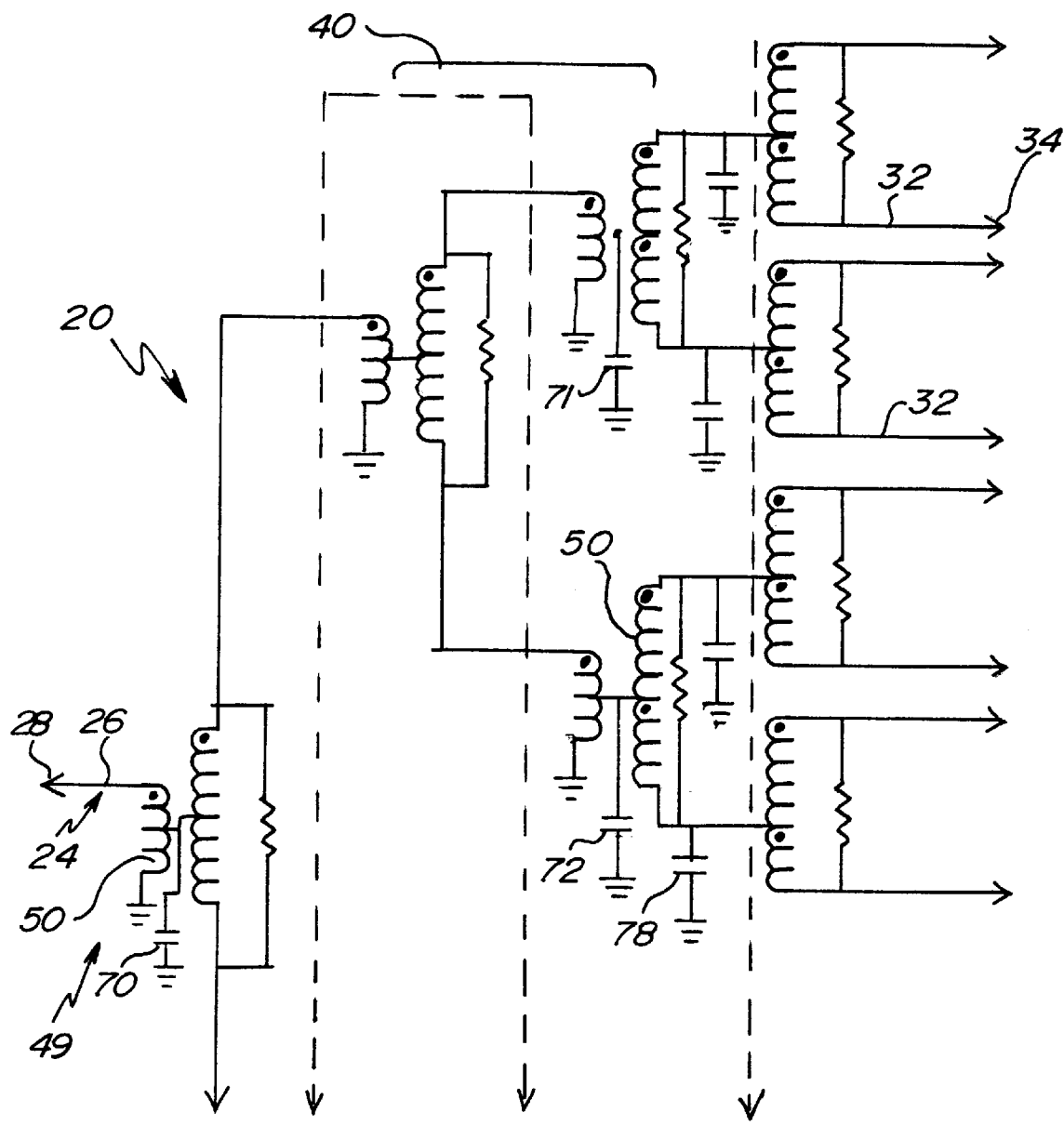
FIGS. 2A and 2B is a schematic diagram of a signal splitter with 16 output lines according to the invention.
Figure 2B:
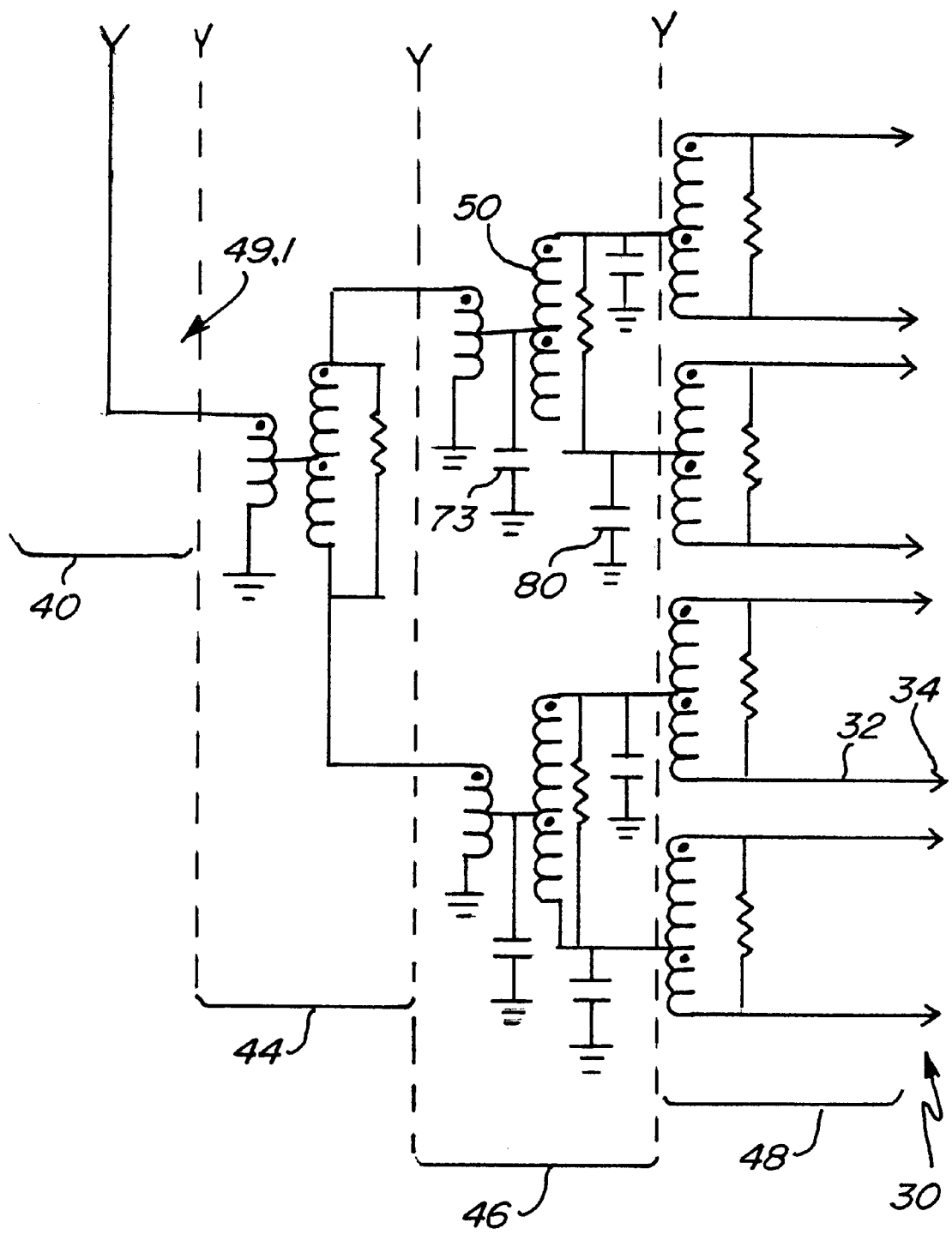

Referring to FIGS. 1, 2A, and 2B schematic diagrams of a eight output line splitter and a sixteen output line splitter are shown and are generally designated with the numerals 20 and 21. Each device has an input port 24 comprising an input signal line 26 and an input terminal 28. Each device has an output port 30 comprising output signal lines 32 and terminals 34. Each splitter has an initial splitting stage 40, an intermediate splitting portion 42, an intermediate splitting stage 44, and a final stage 48. The sixteen output line splitter of FIG. 2 has an additional intermediate stage 46. Each stage has an input side 49 and an output side 49.1.

Each splitting stage transformer 50 comprising a bi-trifilar winding 51 with a center tap 52 and with winding ends 53, 54 on a toroid core with a permeability of 7500 or greater. In the typical arrangement the center tap 52 receives the input signal and the winding ends provide the split signal output. In such an arrangement the characteristic impedance of the lines extending from the winding ends is twice that of the first characteristic impedance of the signal line attached to the center tap. Thus as shown in FIGS. 1, 2A, and 2B matching transformers 56 may be utilized to modify the characteristic impedance so that the characteristic impedance of the output signal lines is a desired value.

The matching transformers have a winding 57, a tap 58 constituting an signal output line, and winding ends 59 on a toroid core with a permeability of 7500 or greater. One of the winding ends is grounded and the other constitutes the signal input line to the transformer. In conventional prior art multilevel signal splitters the matching transformer functions to decrease the characteristic impedance by the reciprocal of the factor that the distribution transformer increases the characteristic impedance. In the typical splitter the matching transformer will operate to provide a characteristic impedance of one half the characteristic impedance at the input.

Figure 5:
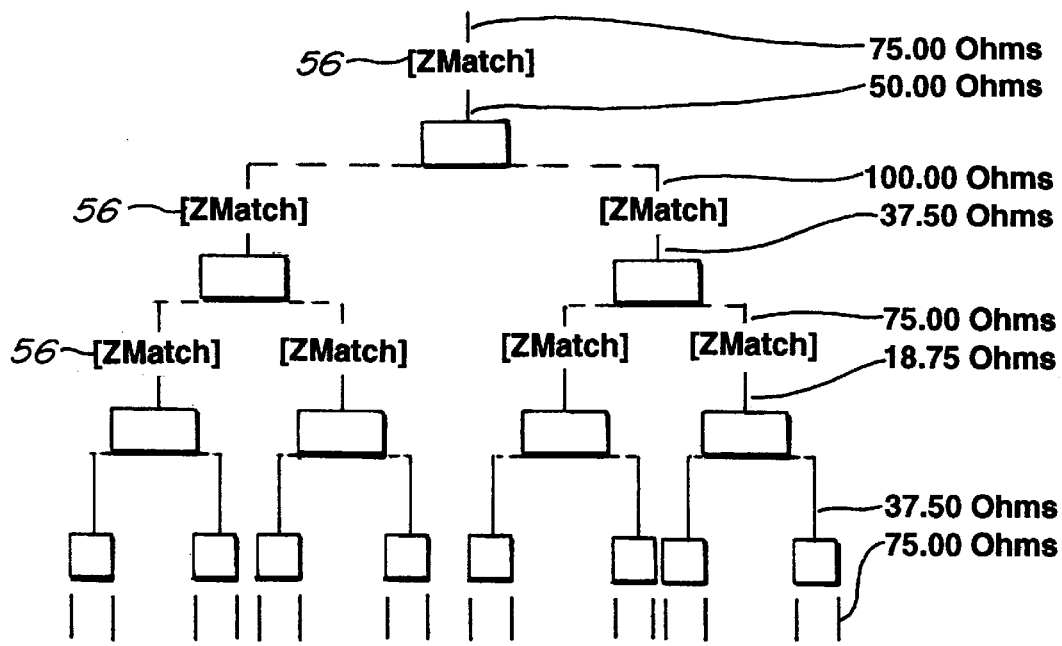
FIG. 5 is a block diagram illustrating suitable impedance matching in accordance with the invention.

As shown in the FIGS. 1, 2A, 2B and 5, an aspect of the present invention is to utilize the matching transformers on the initial stage and intermediate stages but not the final stage. The matching transformers 56 may have impedance ratio other than 2:1, for example, the matching transformer in the initial stage of the example of FIG. 5 is 3:2. These matching transformers in conjunction with the centertap 1:2 distribution transformers provide a characteristic impedance at the output substantially the same as at the input. In a conventional CATV distribution system, this characteristic impedance would be 75 ohms. The above described configuration provides the advantage not only of utilizing fewer components but also providing better performance characteristics over a broader frequency range. For example, the input side return loss is less frequency sensitive utilizing the above configuration.

Figure 6:
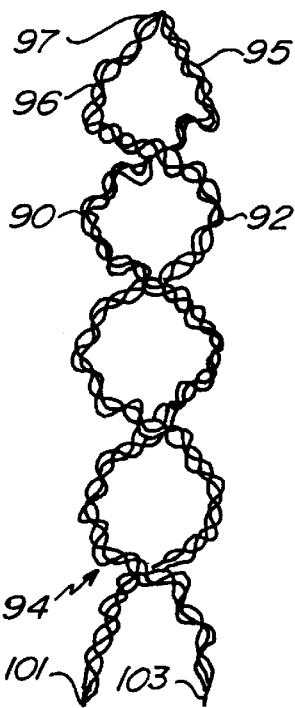
FIG. 6 is a bi-trifilar rope to create a bi-trifilar winding.
Figure 7:
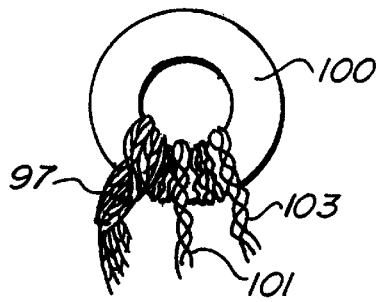
FIG. 7 is an elevational view of a transformer with a bi-multiplefilar winding in accordance with the invention.

Referring to FIGS. 6 and 7, a bi-trifilar winding arrangement as shown, may be utilized for both the distribution transformers and the matching transformers. This winding configuration appears to minimizes the parasitic inductance in the transformers. Two ropes 90, 92, each comprised of three insulated wires (38 AWG is suitable) twisted together are further twisted together into a single bi-trifilar rope 94. The strands will be in close engagement with each other, the "looseness" in FIG. 6 is for illustrating the relative positioning of the strands. The two ends 95, 96 are soldered together which will comprise the tap 97 of the transformer. The three strands of the other two winding ends 101, 103 are similarly soldered together. The bi-trifilar rope is wound around a high permeability core 100, with the center tap 97 and two winding ends 101, 103 extending downwardly for attachment to the circuit board 106.

Referring to FIGS. 1, 2A, and 2B capacitors 60, 62, 63, 64, 65, 66, 67, 70, 71, 72, 73, 74, 75, 76, 77, 78, 79, 80, 81, 82 may be utilized to lower inductances throughout the circuits. Appropriate values of these capacitors are 1.5 to 3 picofarads.

Resistors 112 bridge each split of the distribution transformers and provide output signal line isolation. An appropriate value for these resistors has been found to be 300 ohms.

Figure 3:
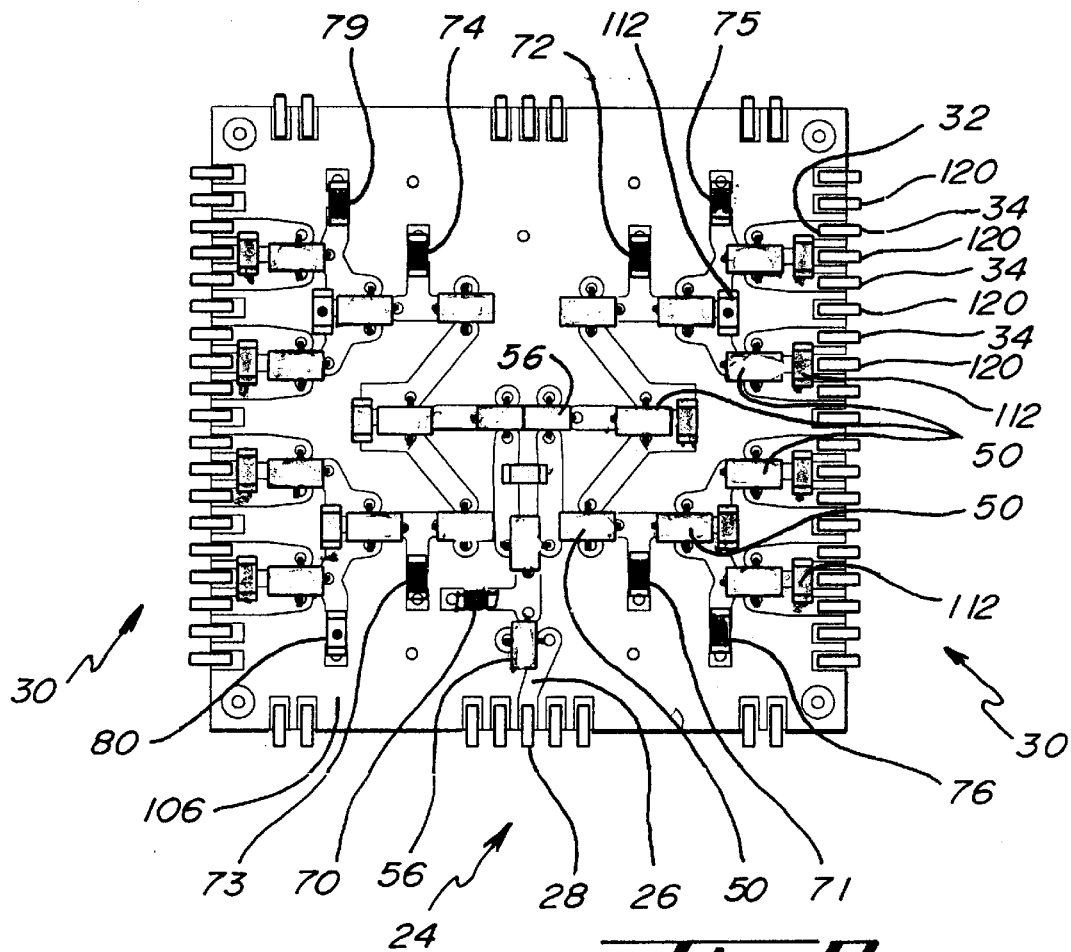
FIG. 3 is a top plan view of an embodiment of the invention.
Figure 4:
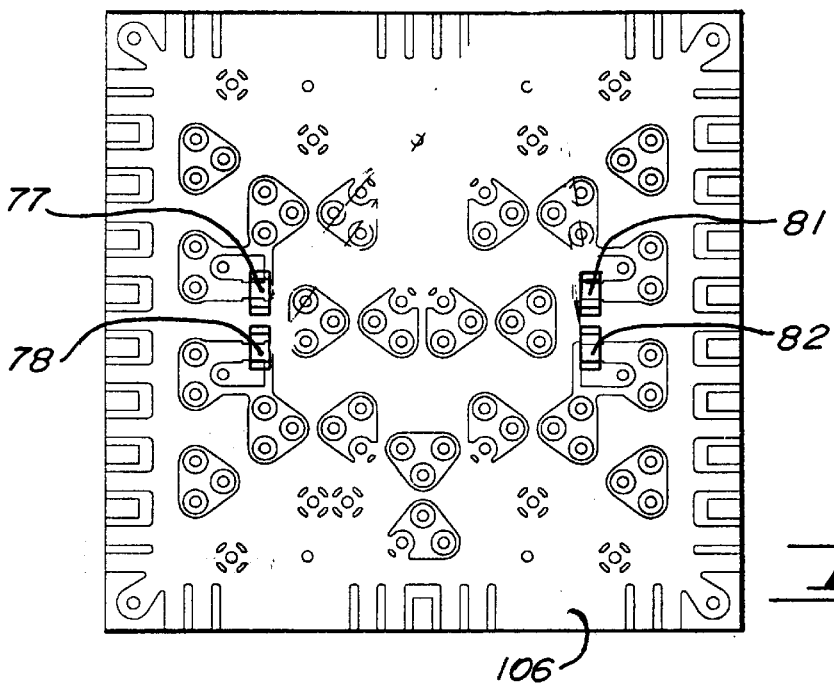
FIG. 4 is a bottom plan view of an embodiment of the invention.
Figure 8:
FIG. 8 is an elevational view of a splitter packaged as a surface mount device in accordance with the invention.

Referring to FIGS. 3, 4, and 8 views of a suitable package for the splitter of FIG. 2A and 2b is shown. J style lead pin clips are utilized with the module arranged as a 84 pin PLCC style surface mount device. This provides a standard JEDEC package style readily usable with tape and reel tooling. Note that the output signal lines 34 are placed intermediate grounded terminals 120 to greatly improve RF ground characteristics and reduce pin to pin crosstalk.

We claim:

1. A signal splitter comprising:

an input port comprising an input signal line at a first characteristic impedance and an output port comprising a plurality of output signal lines, each output signal line having a characteristic impedance substantially matching the first characteristic impedance, a plurality of splitting stages comprising an initial splitting stage, an intermediate portion comprising at least one intermediate splitting stage, and a final splitting stage, the initial splitting stage comprising a transformer with a bi-multiplefilar winding with two winding ends and a center tap, the center tap connecting to the input signal line, the winding ends extending to the intermediate portion;

the intermediate portion having intermediate input signal lines and intermediate output signal lines, the intermediate stage comprising a plurality of distribution transformers each with a bi-trifilar winding having two ends and a center tap therebetween;

the final stage comprising a plurality of distribution transformers, each distribution transformer having a bi-multiplefilar winding with a center tap and two winding ends, the center taps of each of said distribution transformers connecting to the intermediate output signal lines, the winding ends connecting to the plurality of signal output lines at the output port.

2. The splitter of claim 1 further comprising a plurality of matching transformers with bi-multiplefilar windings positioned ahead of a plurality of the distribution transformers.

3. The splitter of claim 2 wherein the matching transformers are positioned in the initial splitting stage and the intermediate portion and there are no matching transformers in the final stage.

4. The splitter of claim 1 wherein the distribution transformers and the matching transformers are wound on toroid cores.

5. The splitter of claim 1 further comprising a plurality of resistors, with each of said resistors positioned across the winding ends of the distribution transformers.

6. The splitter of claim 5 wherein each distribution transformer has one of said resistors positioned across each of said transformer's winding ends.

7. The splitter of claim 1 wherein the splitter stages are mounted on a circuit board configured as a surface mount component with a plurality of terminals extending therefrom, and wherein the input signal line is connected to one of said terminals, and wherein the output signal lines of the final splitting stage are connected to said terminals.

8. The splitter of claim 7 wherein a plurality of said terminals extending from the circuit board are grounded terminals and wherein each of the terminals connected to the output signal lines are positioned intermediate two of said grounded terminals.

9. The splitter of claim 7 wherein the terminals are j-shaped.

10. A signal splitter comprising:

a) a base for mounting components thereon;

b) an input port with an input port signal line extending thereon on the base;

c) a plurality of splitter stages arranged in a multi-level fashion on said base, each splitter stage having an input side and an output side, the input side having at least one input signal line and the output side having two output signal lines for each input signal line, each stage having at least one transformer with a center tapped winding for receiving an input signal and a pair of winding ends for splitting said input signal, each of said winding ends having a resistor thereacross for providing signal isolation for each of the winding ends, said input port signal line coupled to the input signal line of a first splitter stage;

d) an output port with a plurality of output signal lines extending therefrom, said output signal lines coupled to the winding ends of the last splitter stages; and e) wherein the base comprises a circuit board and wherein the splitter further comprises a plurality of terminals extending from the base including a plurality of grounded terminals and wherein each output signal line is connected to one of said terminals defining an output signal terminal and wherein each output signal terminal is positioned intermediate a pair of grounded terminals.

11. The splitter of claim 10 wherein the terminals are j-shaped and the splitter is configured as a surface mount component.

12. A signal splitter comprising:

a) a base for mounting components thereon;

b) an input port with an input port signal line extending thereon on the base;

c) a plurality of splitter stages arranged in a multi-level fashion on said base, each splitter stage having an input side and an output side, the input side having at least one input signal line and the output side having two output signal lines for each input signal line, each stage having at least one transformer with a center tapped winding for receiving an input signal and a pair of winding ends for splitting said input signal, each of said winding ends having a resistor thereacross for providing signal isolation for each of the winding ends, said input port signal line coupled to the input signal line of a first splitter stage;

d) an output port with a plurality of output signal lines extending therefrom, said output signal lines coupled to the winding ends of the last splitter stages; and e) wherein each transformer has a bi-trifilar winding with a center tap and two winding ends.

13. A signal splitter comprising:

a) an input port with an input port signal line extending therefrom;

b) a plurality of splitter stages, arranged in a multi-level fashion, each splitter stage having an input side and an output side, the input side having at least one input signal line and the output side having two output signal lines for each input signal line, each stage having at least one transformer with a center tapped winding for receiving an input signal and a pair of winding ends for splitting said input signal, each of said pairs of winding ends having a resistor thereacross for providing signal isolation for each of the two output signal lines, said input port signal lines coupled to the input signal line of a first splitter stage;

c) an output port with a plurality of output signal lines extending therefrom, said output signal lines coupled to the winding ends of the last splitter stages; and d) a base comprising a circuit board and wherein the splitter further comprises a plurality of terminals extending from the base including a plurality of grounded terminals and wherein each output signal line is connected to one of said terminals defining an output signal terminal and wherein each output signal terminal is positioned intermediate a pair of grounded terminals.

14. The splitter of claim 13 wherein the terminals are j-shaped and the splitter is configured as a surface mount component.

15. The splitter of claim 14 further comprising a base and wherein the base comprises a circuit board on which the transformers are mounted and wherein the transformers are each comprised of a toroid core.

16. A signal splitter comprising:

a) an input port with an input port signal line extending therefrom;

b) a plurality of splitter stages, arranged in a multi-level fashion, each splitter stage having an input side and an output side, the input side having at least one input signal line and the output side having two output signal lines for each input signal line, each stage having at least one transformer with a center tapped winding for receiving an input signal and a pair of winding ends for splitting said input signal, each of said pairs of winding ends having a resistor thereacross for providing signal isolation for each of the two output signal lines, said input port signal lines coupled to the input signal line of a first splitter stage;

c) an output port with a plurality of output signal lines extending therefrom, said output signal lines coupled to the winding ends of the last splitter stages; and d) wherein each transformer comprises a bi-trifilar winding with a center tap and two winding ends.

* * * * *

UNITED STATES PATENT AND TRADEMARK OFFICE
CERTIFICATE OF CORRECTION

PATENT NO. : 6,118,354
DATED : September 12, 2000
INVENTOR(S) : John E. Decramer, Franklin B. Gass It is certified that error appears in the above-identified patent and that said Letters Patent is hereby corrected as shown below:

Title page,
Inventors name, "Decramer et al." should be -- DeCramer et al. --

Column 1,
Line 44, "multi level" should be -- multi-level --.
Line 50, "stages" should be -- stage --.

Column 2,
Line 5, "is" should be -- are --.
Line 15, "reduces" and "increases" should be -- reduce -- and -- increase --.
Line 30, "is" should be -- are --.
Line 57, "a" should be -- an --.
Line 65, "FIG. 2" should be -- FIGs. 2A, 2B --.

Column 3,
Line 14, "an" should be -- a --.
Line 44, "minimizes" should be -- minimize --.

Column 4,
Line 13, a new paragraph should begin after "impedance". The 3 indentations following should be indented as subparagraphs if "a plurality of splitting ...".

Column 6,
Line 25, please delete "further comprising a base and".

Signed and Sealed this

Twenty-sixth Day of March, 2002

Attest:

JAMES E. ROGAN
Attesting Officer    Director of the United States Patent and Trademark Office